United States Patent
Tenne et al.

(10) Patent No.: US 6,841,142 B1
(45) Date of Patent: Jan. 11, 2005

(54) BULK SYNTHESIS OF LONG NANOTUBES OF TRANSITION METAL CHALCOGENIDES

(75) Inventors: Reshef Tenne, Rehovot (IL); Aude Rothschild, Chevreuse (FR); Moshe Homyonfer, New York, NY (US)

(73) Assignee: Yeda Research and Development Co., Ltd., Rehovot (IL)

( * ) Notice: Subject to any disclaimer, the term of this patent is extended or adjusted under 35 U.S.C. 154(b) by 0 days.

(21) Appl. No.: 09/959,664

(22) PCT Filed: May 2, 2000

(86) PCT No.: PCT/IL00/00251

§ 371 (c)(1),
(2), (4) Date: Jan. 28, 2002

(87) PCT Pub. No.: WO00/66485

PCT Pub. Date: Nov. 9, 2000

(30) Foreign Application Priority Data

May 2, 1999 (IL) ................................................. 129718

(51) Int. Cl.⁷ .......................... C01B 19/04; C01G 39/00; C01G 35/00; C01G 23/00; C01G 55/00
(52) U.S. Cl. ..................... 423/509; 423/561.1; 423/565; 423/566.1
(58) Field of Search ................................ 423/508, 509, 423/563, 564, 592.1, 561.1, 511, 606, 565, 566.1

(56) References Cited

U.S. PATENT DOCUMENTS

| | | | | |
|---|---|---|---|---|
| 4,055,630 A | * | 10/1977 | McCoy et al. | 423/509 |
| 4,299,892 A | * | 11/1981 | Dines et al. | 429/194 |
| 4,390,514 A | * | 6/1983 | Chianelli et al. | 423/509 |
| 4,548,800 A | * | 10/1985 | Badesha et al. | 423/510 |
| 4,676,969 A | * | 6/1987 | Smith | 423/509 |
| 5,958,358 A | | 9/1999 | Tenne et al. | 423/561.1 |

FOREIGN PATENT DOCUMENTS

| | | |
|---|---|---|
| EP | 0 580 019 B1 | 1/1994 |
| WO | WO 97/44278 A1 | 11/1997 |
| WO | WO 98/23796 A1 | 6/1998 |

OTHER PUBLICATIONS

Y. Feldman et al., "High–Rate, gas–Phase Growth of $MoS_2$ Nested Inorganic Fullerenes and Nanotubes", Science, Jan. 13, 1995, pp. 222–225, vol. 267.

Y. Feldman et al., "Bulk Synthesis of Inorganic Fullerene-–like $MS_2$(M=Mo, W) from the Respective Trioxides and the Reaction Mechanism", Journal of the American Chemical Society, 1996, pp. 5362–5367, vol. 118, No. 23.

M. Hershfinkel et al., "Nested Polyhedra of $MX_2$(M=W, Mo; X=S, Se) Probed by High–Resolution Electron Microscopy and Scanning Tunneling Microscopy", Journal of the American Chemical Society, 1994, pp. 1914–1917, vol. 116.

M. Remskar et al., "$MoS_2$ as Microtubes", Appl. Phys. Lett., Jul. 15, 1996, vol. 69, No. 3.

(List continued on next page.)

Primary Examiner—Wayne A. Langel
(74) Attorney, Agent, or Firm—Browdy and Neimark, P.L.L.C.

(57) ABSTRACT

Nanotubes of transition metal chalcogenides as long as 0.2–20 microns or more, perfect in shape and of high crystallinity, are synthesized from a transition metal material, e.g. the transition metal itself or a substance comprising a transition metal such as an oxide, water vapor and a $H_2X$ gas or $H_2$ gas and X vapor, wherein X is S, Se or Te, by a two-step or three-step method including first producing nanoparticles of the transition metal as long as 0.3 microns, and then annealing in a mild reducing atmosphere of the aforementioned gas or gas mixture. The transition metal chalcogenide is preferably $WS_2$ or $WSe_2$. Tips for scanning probe microscopy can be prepared from said long transition metal chalcogenide nanotubes.

15 Claims, 10 Drawing Sheets

OTHER PUBLICATIONS

M. Remskar et al., "New Crystal Structures of $WS_2$: Microtubes, Ribbons, and Ropes", *Adv. Mater.,* 1998, pp. 246–249, vol. 10, No. 3.

M. Remskar et al., "Stabilization of the Rhombohedral Polytype in $MoS_2$ and $WS_2$ Microtubes: TEM and AFM Study", *Surface Science,* 1999, pp. 637–641, vol. 435.

M. Remskar et al., "Syntactic Coalescence of $WS_2$ Nanotubes", *Applied Physics Letters,* Jun. 14, 1999, pp. 3633–3635, vol. 74, No. 24.

R. Tenne et al., "Polyhedral and Cylindrical Structures of Tungsten Disulphide", *Nature,* Dec. 1992, pp. 444–445, vol. 360.

C.M. Zelenski et al., "Template Synthesis of Near–Monodisperse[1] Microscale Nanofibers and Nanotubules of $MoS_2$", *J. Am. Chem. Soc.,* 1998, pp. 734–742, vol. 120.

Ajayan, P.M. et al; "Carbon nanotubes as removable tamplates for metal oxide nanocomposites and nanostructures"; *Nature,* vol. 375, pp. 554–567, (no month).

Chopra, N.G. et al; "Boron Nitride Nanotubes"; *Science;* vol. 269; 1995; pp. 966–967, (no month).

Dai, H. et al; "Nanotubes as nanoprobes in scanning probe microscopy"; *Nature;* vol. 384; 1996; pp. 147–150, (no month).

Feldman, Y. et al; "Kinetics of Nested Inorganic Fullerene–like Nanoparticle Formation"; *J. Am. Chem. Soc.;* vol. 120; 1998, pp 4176–4183, (no month).

Frey, G.L; "Optical properties of MS2 (M=Mo, W) inorganic Fullerene–like and nanotube material optical absorption and resonance Raman measurements"; *J. Mater Res.* vol. 13, No. 9, 1998; pp. 2412–2417, (no month).

Glemser, O. "Zur Frage der Wolframblauverbindungen"; *J. Mater.Res.* 1998; 13, 2412, (no month).

Hardcastle, F.D.; "Determination of the Molecular Structures of Tungstates by Raman Spectroscopy"; *Journal of Raman Spectroscopy,* vol. 26, 1995; pp. 397–405, (no month).

Horsley, J.A.; Structure of Surface Tungsten Oxide Species in the WO3/A1203 Supported Oxide System from X–ray Absorption Near–Edge Spectroscopy and Raman Spectroscopy; *J. Phys. Chem.* vol. 91, 1987; pp. 4014–4020, (no month).

Iguchi, E.; "Strain Energy Between CS Planes"; *Journal of Solid State Chemistry;* vol. 23, 1978; pp. 231–239, (no month).

Iijima, S. "Helical microtubules of Graphitic carbon"; *Nature;* vol. 354; 1991; pp. 56–58, (no month).

Margulis, L. "Nested fullerene–like structures"; *Nature;* vol. 365, 1993; pp. 113–114, (no month).

Miyano, T. et al; "High–Resolution Electron Microscopic Studies of CS Structure in Reduced WO3 Thin Crystals"; *Japanese Journal of Applied Physics;* vol. 22, 1983; pp. 863–868, (no month).

Sloan, J. et al; "Defect and Ordered Tungsten Oxides Encapsulated Inside 2H–WX2 (X=S and Se) Fullerene–Related Structures"; *Journal of Solid State Chemistry,* vol. 144, 1999; pp. 100–117, (no month).

Sloan, J. et al; "Effect of tip shape on surface roughness measurements from atomic force microscopy images of thin films"; *J. Vac. Sci. Technol.* B 13(2), 1995; pp. 344–349, (no month).

\* cited by examiner

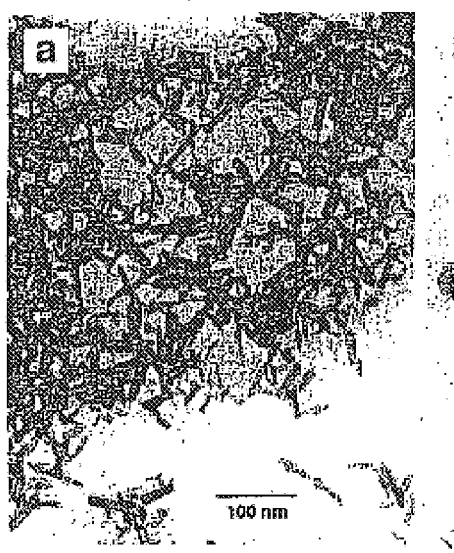 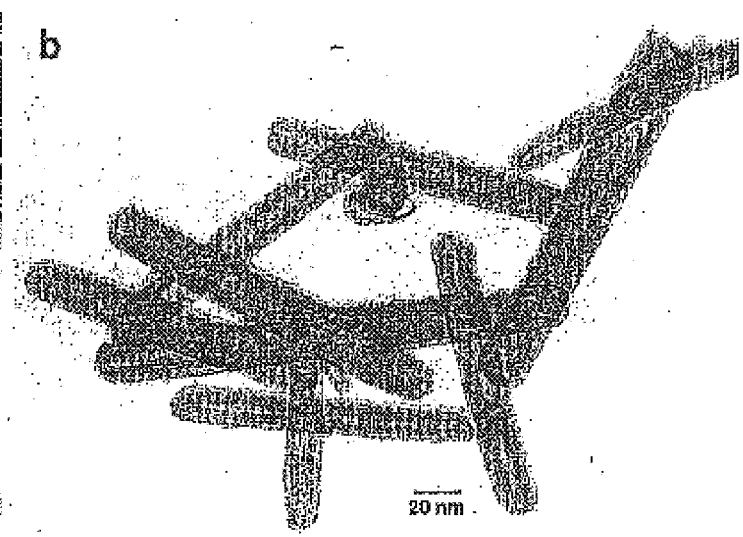
Fig. 1a                                    Fig. 1b (a) P=5 T      (b) P=12 T      (c) P=20 T

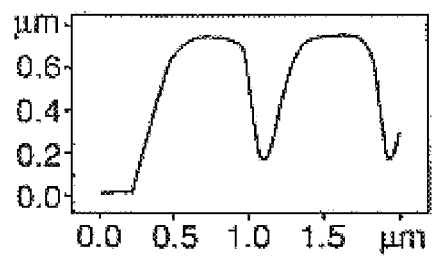
Fig.9a
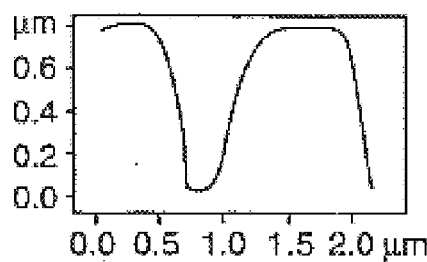
Fig.9c
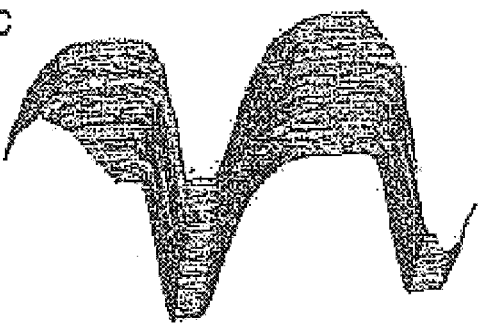
Si tip
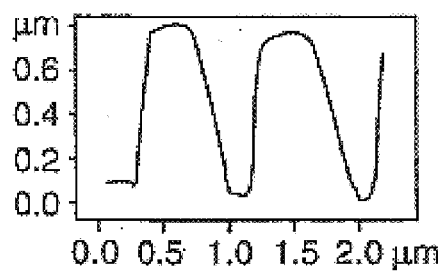
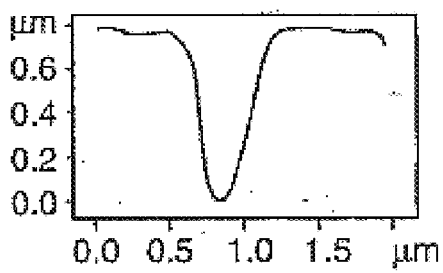
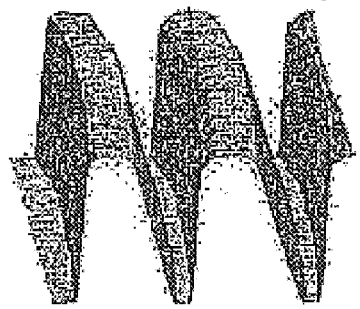
Fig.9b
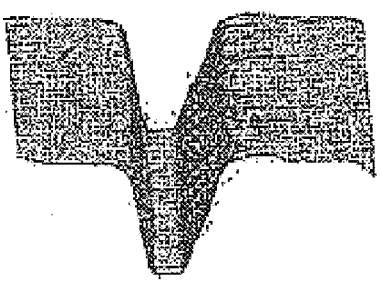
Fig.9d
WS$_2$ nanotube tip

US 6,841,142 B1

BULK SYNTHESIS OF LONG NANOTUBES OF TRANSITION METAL CHALCOGENIDES

REFERENCE TO RELATED APPLICATIONS

The present application is the national stage under 35 U.S.C. 371 of international application PCT/IL00/00251, filed May 2, 2000 which designated the United States, and which international application was published under PCT Article 21(2) in the English language.

FIELD OF THE INVENTION

The present invention relates to methods for the bulk synthesis of long nanotubes of transition metal chalcogenides and to methods for preparation of tips for scanning probe microscopy from said long nanotubes. Background of the Invention The discovery of carbon nanotubes in 1991 (Iijima, 1991) has generated intense experimental and theoretical interest over the last few years because of their unusual geometry and physical properties. Besides the original carbon structure, similar inorganic structures have also emerged: BN (Chopra et al., 1995), $V_2O_5$ (Ajayan et al., 1995), $MoS_2$ (Feldman et al., 1995; Remskar et al., 1998 and 1999a; Zelensky et al., 1998); and $WS_2$ (Tenne et al., 1992; Remskar et al., 1998, 1999a and 1999b). The reason for such an analogy between the pure carbon and inorganic structures is based on the fact that they all stem from lamellar (2D) compounds.

The case of the layered transition-metal dichalcopenides ($WS_2$ and $MoS_2$) was the first example of such an analogy. Indeed, in 1992, IF (inorganic fullerene-like) structures and nanotubes of $WS_2$ were reported by the laboratory of the present inventors (Tenne et al., 1992; EP 0580019; U.S. Pat. No. 5,958,358), followed shortly by similar results on $MoS_2$ (Margulis et al., 1993) and the respective selenides (Hershfinmkel et al., 1994). However, it is noteworthy to underline that the samples contained minute amounts of IF particles. Instead, most of the samples consisted of $WS_2$ platelets ($2H$-$WS_2$). The nanotubes were relatively rare and constituted even a smaller fraction of the total composition. Besides this statistical fact, the reproducibility of the nanotubes growth was rather poor. Consequently a lot of effort has been recently devoted to the study of nanotubes from new other related materials.

None of the methods described recently for the synthesis of $WS_2$ and $MoS_2$ nanotubes mentioned above permit synthesis of bulk quantities of a single phase of inorganic nanotubes and mostly perfect inorganic nanotubes to be obtained.

SUMMARY OF THE INVENTION

It is an object of the present invention to provide methods for the bulk synthesis of inorganic nanotubes, particularly of long nanotubes of transition metal chalcogenides.

In one aspect, the invention relates to a two-step method for bulk synthesis of long nanotubes of transition metal chalcogenides from a transition metal material, water vapor and a $H_2X$ gas or $H_2$ gas and X vapor, wherein X is S, Se or Te, said method comprising:

a) either heating a transition metal material in the presence of water vapor in a vacuum apparatus or electron beam evaporating a transition metal material in the presence of water vapor, at a suitable pressure, to obtain nanoparticles of the transition metal oxide as long as 0.3 microns; and b) annealing the transition metal oxide nanoparticles obtained in step (a) in a mild reducing atmosphere with a $H_2X$ gas or $H_2$ gas and X vapor, wherein X is S, Se or Te, at a suitable temperature, in order to obtain long nanotubes of the transition metal chalcogenide.

In alternative routes, in order to obtain larger nanotubes, either a foil of the transition metal is heated in poor vacuum conditions (e.g. 1 Torr) or nanoparticles of the transition metal oxide as large as 0.3 microns of step (a) are further elongated, to obtain transition metal oxide whiskers/nanoparticles as long as 10–20 microns or more, which are then annealed with the $H_2X$ gas or with $H_2$ gas and X vapor.

Thus, according to another embodiment, the invention relates to a three-step method for bulk synthesis of long nanotubes of a transition metal chalcogenide from a transition metal material, water vapor and a $H_2X$ gas or with $H_2$ gas and X vapor, wherein X is S, Se or Te, said method comprising:

a) either heating a transition metal material in the presence of water vapor in a vacuum apparatus or electron beam evaporating a transition metal material in the presence of water vapor, at a suitable pressure, to obtain nanoparticles of the transition metal oxide as large as 0.3 microns;

b) elongating the transition metal oxide nanoparticles as large as 0.3 microns of step (a) to obtain nanoparticles as long as 20 microns or more; and c) annealing the elongated transition metal oxide nanoparticles obtained in step (b) in a mild reducing atmosphere with a $H_2X$ gas or with $H_2$ gas and X vapor, wherein X is S, Se or Te, at a suitable temperature, in order to obtain long nanotubes of the transition metal chalcogenide.

The elongation of the transition metal oxide nanoparticles in step (b) can be carried out by any known and suitable method, for example by heating the oxide under mild reducing conditions for a few minutes such as for 5–30, preferably, 10 minutes, or by electron beam irradiation of the oxide in high vacuum conditions.

When a mixture of nanotubes of two different metal chalcogenides is desired, for example metal sulfide and metal selenide, the annealing step is carried out by alternating the annealing atmosphere, for example, by alternating $H_2S$ and $H_2Se$ gas or by alternating the S and Se vapors in the presence of $H_2$.

The nanotubes obtained by the methods of the invention are perfect in shape and of high cristallinity and may be 0.2–20 micron long or more. For the sake of convenience, the nanotubes of the invention shorter than 0.5 microns are sometimes herein in the specification referred to as "short" nanotubes to distinguish them from the longer nanotubes.

The metal material may be the transition metal itself, a mixture of or an alloy of two or more transition metals, a substance comprising a transition metal, e.g. an oxide, and a mixture of substances comprising two or more transition metals. Examples of transition metals include, but are not limited to, Mo, W, V, Zr, Hf. Pt. Re, Nb, Ta, Ti, and Ru. The electron beam evaporation embodiment is more suitable for refractory transition metals, e.g. Nb, V, Ta, Ti.

In one preferred embodiment, the invention relates to a two-step method for bulk synthesis of long nanotubes of $WS_2$ and/or $WSe_2$ which comprises:

a) either beating W in the presence of water vapor in a vacuum apparatus, or electron beam evaporating W or $WO_3$ in the presence of water vapor, at a pressure of 1–20, preferably 8–12, Torr, thus obtaining $WO_3$ nanoparticles as large as 0.3 microns; and b) annealing the $WO_3$ nanoparticles obtained in step (a) in a mild reducing atmosphere with $H_2S$ or $H_2Se$ gas or with $H_2$ and S or Se vapor, or by alternating the annealing atmosphere with $H_2S$ and $H_2Se$ or with $H_2$ and S or Se vapor, at 800–850° C., preferably at 835–840° C., thus obtaining relatively long and hollow $WS_2$ and/or $WSe_2$ nanotubes as long as 10 microns or more.

Longer $WS_2$ and $WSe_2$ nanotubes can be obtained when in step (a) a W foil is heated in poor vacuum conditions, eg. of 1 Torr, and the long tungsten oxide whiskers obtained are then annealed sulfidized or selenized.

In another preferred embodiment, the invention relates to a three-step method for bulk synthesis of long nanotubes of $WS_2$ and/or $WSe_2$ which comprises:

a) either heating W in the presence of water vapor in a vacuum apparatus or electron beam evaporating W or $WO_3$ in the presence of water vapor, at a pressure of 1–20, preferably 8–12, Torr, thus obtaining $WO_3$ nanoparticles as large as 0.3 microns;

b) heating the $WO_3$ nanoparticles as long as 0.3 microns under mild reducing conditions at 800–850° C., preferably at 835–840° C., for about 10 minutes to obtain $WO_3$ nanowhiskers as long as 10 microns; and c) annealing the $WO_3$ nanoparticles obtained in step (b) in a mild reducing atmosphere with $H_2S$ or $H_2Se$ gas or with $H_2$ and S or Se vapor, or by alternating the annealing atmosphere with $H_2S$ and $H_2Se$ or with $H_2$ and S or Se vapor, at 800–850° C., preferably at 835–840° C., thus obtaining relatively long and hollow $WS_2$ and/or $WSe_2$ nanotubes as long as 10 microns or more.

The mild reducing conditions for elongation of the oxide nanoparticles in step (b) of the three-step method include, for example, heating the oxide nanoparticles under the flow of $H_2$ (0.05–1.0%)/$N_2$ (99.95–99%)-110 ml/min gas stream for up to 10 minutes. Under these conditions, elongation of the oxide nanoparticles is achieved. With higher amounts of $H_2$, e.g. above 5% $H_2$, no elongation is obtained.

The mild reducing atmosphere for annealing the oxide nanoparticles includes, for example, sulfidization or selenization under the flow of $H_2$ (1%)/$N_2$ (99%)-110 ml/min and $H_2S$,-1 ml/min. If the flow of $H_2S$ is lower than 1 ml/min, then longer transition metal chalcogenide nanotubes are obtained.

The invention further relates to long transition metal chalcogenide nanotubes as long as 20 microns or more obtained by a method of the invention. In one embodiment, said transition metal chalcogenide is $WS_2$ and/or $WSe_2$.

The invention additionally relates to tips for scanning probe microscopy (both STM and FTM) and methods for preparation of such tips from the long transition metal chalcogenide nanotubes obtained by the methods of the invention, comprising:

a) transferring adhesive from carbon tape to a microfabricated Si tip; and b) pulling off bundles of said transition metal chalcogenide long nanotubes with this tip from a mat of nanotubes prepared on a different area of the tape.

BRIEF DESCRIPTION OF THE FIGURES

FIG. 1a is a typical TEM image of $WO_{3-x}$ needles 40 nm in length (the scale bar represents 100 nm); FIG. 1b shows hollow $WS_2$ nanotubes obtained from the asymmetric oxide nanoparticles shown in FIG. 1a (the scale bar represents 20 nm).

FIGS. 9A–9D show a comparison of microfabricated sharp Si tip (NT-MDT) and $WS_2$ nanotube tip for measuring deep structures (nominal 670 nm) of varying linewidth. 9A and 9B—microfabricated Si and $WS_2$ nanotube tips, respectively, on 350 nm linewidth structure; 9C and 9D—600 nm linewidth structure. Note that in case of FIG. 9A, the Si tip cannot reach the bottom of the trench, while the nanotube in FIG. 9B is able to follow the trench contour faithfully.

DETAILED DESCRIPTION OF THE INVENTION

Figure 2A:
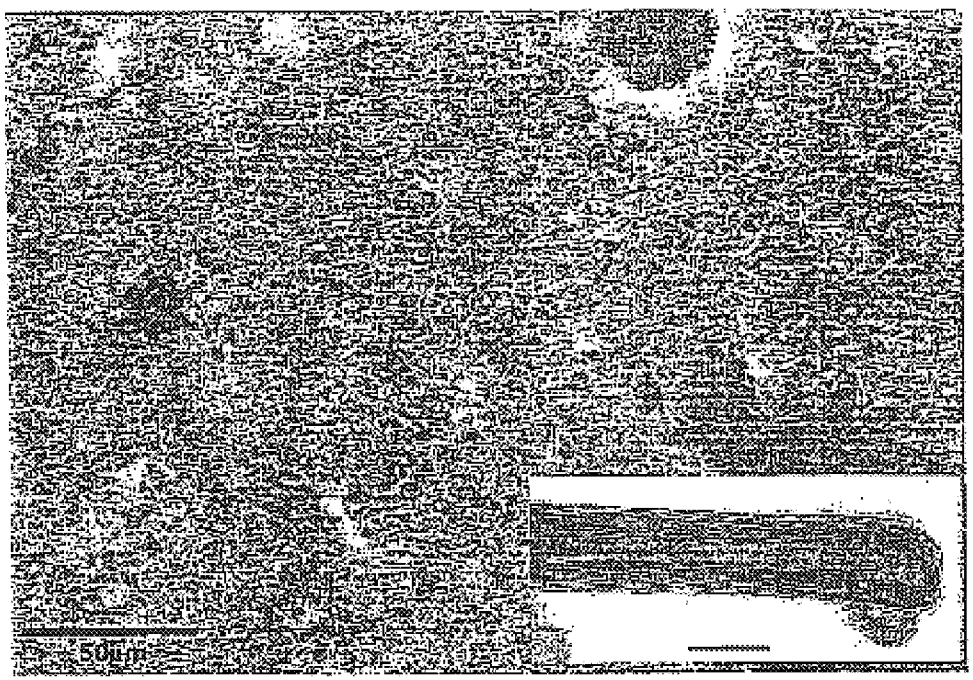
FIGS. 2A–2B are SEM micrographs of a mat of $WS_2$ nanotubes (6–7 sulfide layers) with an oxide core at 2 different magnifications (2A—50 μM; 2B—10 μm). The inset in FIG. 2A shows a typical hollow nanotube obtained after completion of the sulfidization process (the scale bar represents 20 nm). Distance between each two $WS_2$ layers (fringes) is 0.62 nm.

According to the present invention, the synthesis of a pure phase of very long and hollow $WS_2$ nanotubes from short but asymmetric oxide nanoparticles was achieved. In this process, the oxide nanoparticle grows along its longest axis; and subsequently its outermost layer is being sulfidized, while the growing oxide tip remains uncoated as long as the nanowhisker continues to grow. Thereafter, a superlattice of {001}R crystal shear is formed in the oxide core, and the diffusion controlled sulfidization of the oxide core is completed within 60–120 min.

In one embodiments the synthesis of $WS_2$ nanotubes involves two steps, each one carried-out in a separate reactor: first, W is heated in the presence of water vapor in a vacuum apparatus or W or $WO_3$ is electron beam evaporated in the presence of water vapor at a pressure of 1–20 Torr, and then the thus obtained $WO_3$ nanoparticles as large as 0.3 microns are then reacted with $H_2S$ gas under mild reducing conditions.

In order to obtain longer $WS_2$ nanotubes, a three-step can be carried out in which an intermediate step is added for the elongation of the $WO_3$ nanoparticles as large as 0.3 microns before they are reacted with $H_2S$ gas under mild reducing conditions.

The simultaneous reduction and sulfidization reactions were found to be essential for the encapsulation process, which is the key step in the formation of nested fullerene-like $WS_2$ structures from oxide nanoparticles (Feldman et al., 1998). While sulfidization of the sulfide/oxide composite nanoparticle proceeds, more sulfide layers are being added from the outside inwards. Concomitantly, the remaining oxide core is farther reduced and gradually transforms into an ordered superlattice of $\{001\}_R$ CS planes. These planes, which stretch along the whisker's growth's axis can be easily observed by TEM since they present strong contrast modulation. This microscopic structure is a direct manifestation of the reduction process, which affects the homologous series of tungsten suboxides phases $W_nO_{3n-1}$ (Miyano et al., 1983).

A great advantage of the process of the present invention is the absence of almost any contaminant or byproduct. It is also remarkable that no catalyst, which must be separated and dislodged from the nanotube mat at the end of the growth, is necessary in the current process. Therefore, tedious purification steps to isolate the nanotubes, which are time consuming and expensive, are not required once the process is completed.

Similar conditions as described herein for the bulk synthesis of long $WS_2$ nanotubes can be used for carrying out the bulk synthesis of other transition metal chalcogenide nanotubes.

The transition metal chalcogenide nanotubes of the invention can be used for the preparation of tips for scanning probe microscopy by methods well-known in the art, such as the procedure of Dai et al., 1996. Using these tips, images of high aspect ratio replica and evaporated Ti films with sharp asperities became feasible, which could not be achieved with commercially available sharp Si tips.

The invention will now be illustrated by the following non-limiting. Examples.

EXAMPLES

Example 1

Synthesis of $WS_2$ Nanotubes (Experiment A)

1a. Synthesis of Precursor Nanoparticles of $WO_{2.9}$

In the first step (stage I), a powder consisting of asymmetric oxide nanoparticles of ca. 10–30 nm in diameter and a length of 40–300 nm is produced in a high vacuum evaporator. After pumping to $\sim 10^{-4}$ Torr, water vapor from an external reservoir is introduced through a needle valve while pumping with a rotary vane pump so that the pressure can be regulated to any desired value up to the vapor pressure of water at room temperature, ca. 20 Torr. A tungsten filament is heated to $1600\pm 20°$ C. The water molecules react with the hot tungsten filament and produce $(WO_3)_n$ clusters which condense on the walls of the bell jar or, alternatively, onto a water-cooled copper surface. If the water vapor pressure is maintained in the pressure range 8–12 Torr, crystalline oxide nanoparticles with an asymmetric shape are produced. A transmission electron microscope (TEM) image of a typical batch of nanoparticles produced at 12 Torr, is shown in FIG. 1a. Lower vapor pressures (<5 Torr) yield amorphous nanoparticles of a non-defined (spaghetti-like) or spherical shape. It is also noted that the powder color varies with the water vapor pressure and is an excellent indicator for the deviation from stoichiometric yellow-green $WO_3$ phase. Whereas at high vapor pressure (~20 Torr) a powder in light blue color, which is identified by electron diffraction (ED) as a mixture of $WO_3$ and $WO_{2.9}$ is obtained, a deep blue $WO_{2.9}$ phase is accrued under lower water vapor pressure.

1b. Synthesis of Long Nanotubes of $WS_2$ (Two-Step Method

The tungsten oxide powder of Example 1a was collected and 50 mg thereof were transferred to another reactor, in which sulfidization under controlled temperature (835–840° C.), and $N_2/H_2+H_2S$ gas flow takes place. Sulfidization of oxide nanocigars ca. 40 nm long under mild reducing conditions, i.e. $N_2(99\%)/H_2(1\%)$-110 ml/min and $H_2S$-1 ml/min, lead to the formation (ca. 40 mg) of relatively long or "short" nanotubes of $WS_2$ (0.2–0.5 $\mu$m), as shown in FIG. 1b.

When the precursor oxide consisted of nanoparticles 100–300 nm in length (FIG. 1a), nanotubes as long as 10 microns were obtained. FIG. 2 shows typical scanning electron microscope (SEM) images of this phase at two different magnifications, showing a mat of nanotubes consisting of 6 sulfide layers with an oxide core. The formation of hollow $WS_2$ nanotubes from oxide nanowhiskers was followed by both SEM and TEM imaging. While no discrenible changes in the overall shape of the nanoparticles could be observed by the SEM, the detailed microscopic changes, during the oxide to sulfide conversion, could be easily followed by the TEM work.

Figure 2B:
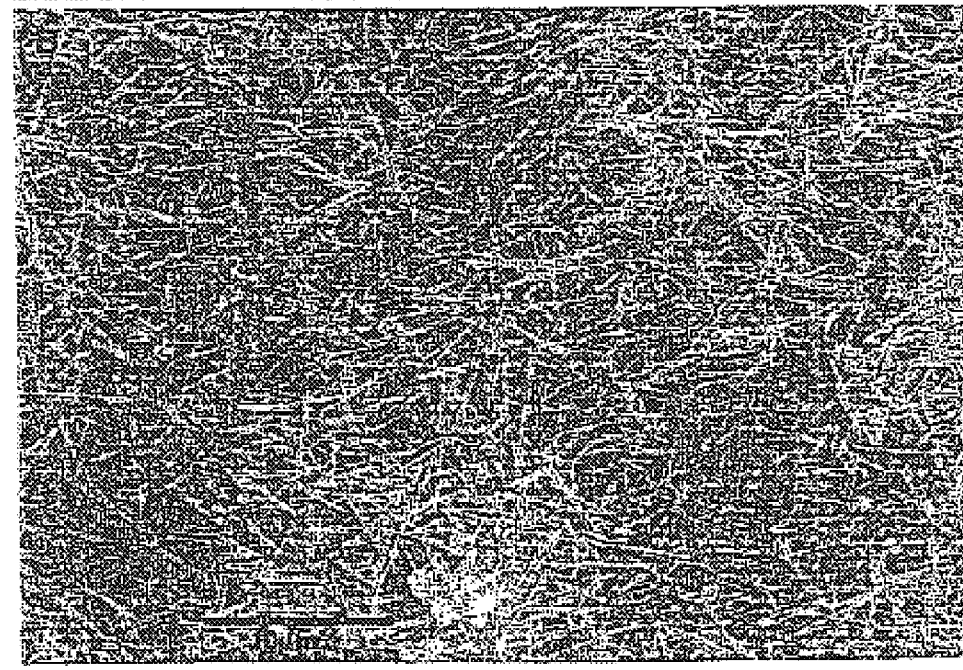

TEM micrograph of the apex of a long and hollow $WS_2$ nanotube, obtained by this method, is shown in the inset of FIG. 2A. While the cross section of the nanotubes is quite similar to that of the precursor nanoparticles, their length increases by a factor of 2040 during the sulfidization step. Note, however, that about 10% of the nanotubes have an enlarged cross-section diameter of app. 100 run.

1c. Elongation of Precursor Nanoparticles of $WO_{2.9}$ (Stage II of Three-Step Method)

In another series of experiments (stage II), app. 5 mg of the amorphous spaghetti-like oxide nanoparticles, were heated to 835–840° C. under the flow of $H_2(1\%)/N_2(99\%)$-110 ml/min gas stream for 10 min. This process yielded a mat of oxide nanowhiskers, typically 10 $\mu$m long and 20–50 nm thick. About 80% of the oxide nanowhiskers, obtained in this way, were thin (ca. 30 nm) and cylindrical in shape. The rest, did not have a circular but rather a rectangular cross section (ca. 10×100 nm). Furthermore, they were completely crystalline and the prevailing oxide phase was identified by ED as $WO_{2.9}$. TEM of the nanowhiskers revealed $\{10\infty\}= \{001\}R$ crystal shear (CS) planes along the [010] growth axis of the nanowhiskers, but the CS planes were not equally spaced. Occasionally however, needles with an ordered CS superlattice were obtained. If the process was overextended, complete reduction of the oxide into tungsten metal nanorods was observed.

1d. Synthesis of Long Nanotubes of $WS_2$ (Stage III of the Three-Step Method)

In the next step (stage III), the elongated oxide nanowhiskers of 1c above were heated at 935–840° C. under the flow of a gas mixture consisting of $H_2S$ (2 ml/min) and $N_2$ (10 ml/min) for 120 min yielding about 4 mg of $WS_2$ nanotubes with characteristics very similar to the one presented in FIG. 2. Nonetheless, a substantial fraction (ca. 20%) of the material, obtained in this way, formed non-perfectly closed nanotubes. Selenization of the same oxide nanowhiskers lead to the formation of very long $WSe_2$ nanotubes, and mixed $WS_2/WSe_2$ nanotubes were also prepared by alternating the annealing atmosphere with $H_2S$ and $H_2Se$.

1e. Characterization of Precursor $WO_{2.9}$ and of $WS_2$ by Raman Spectra

Figure 3:
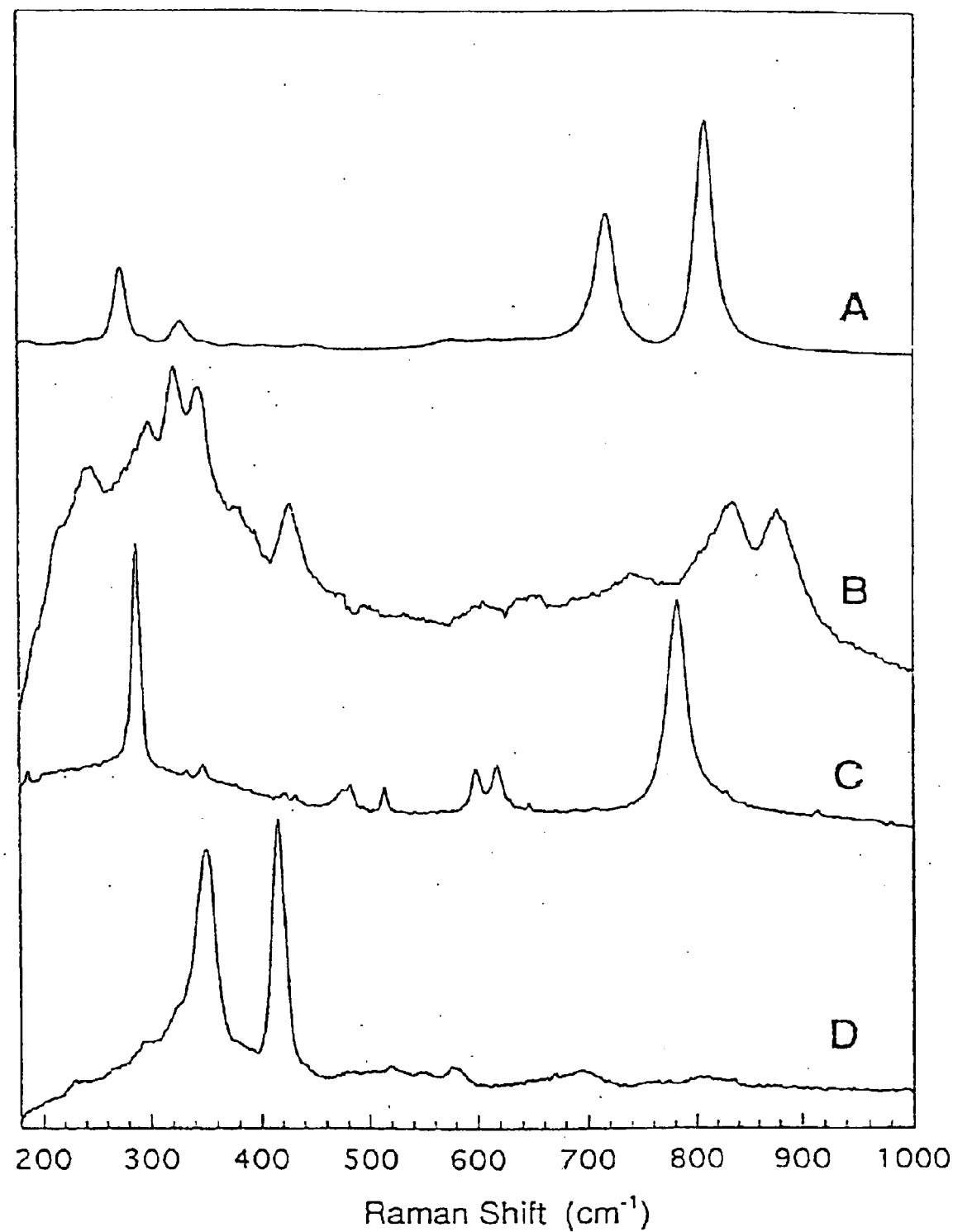
FIG. 3 shows Raman spectra of: curve A. $WO_3$; curve B. $WO_{2.9}$ long nanowhiskers; curve C. $WO_2$ powder; curve D. $WS_2$ nanotubes. Excitation source used: 1 mW 632.8 nm laser beam.

The Raman spectra at different stages of the oxide nanowhisker growth and reduction were measured and are shown in FIG. 3. The spectrum of a pure $WO_3$ powder (curve A) is in good agreement with previous studies (Horsley et al., 1987). The signal of the $WO_{2.9}$ precursors, which are X-ray amorphous, consisted of an intense background, indicating that these oxide nanoparticles are indeed amorphous. Unfortunately, the strong absorption and Raman scattering of the sulfide envelope hides the Raman pattern of the oxide core, in the partially sulfidized nanowhiskers. In order to gain some insight into the structure of the reduced oxide nanowhiskers, its Raman spectrum was measured. Curve B shows a spectrum of the 3–10 µm long oxide nanowhiskers (prepared in stage II), which have partially ordered shear structure $\{001\}_R$. The Raman spectrum of $WO_2$, which was not reported hitherto, is shown in curve C. Finally, the Raman spectrum of the $WS_2$ nanotubes (prepared in stage III) coincides with that of crystalline $2H-WS_2$ (curve D) (Frey et al., 1998).

The absence of data in the literature for the Raman of the reduced $WO_{3-x}$ ($0<x \leq 1$) phases probably reflects the difficulty to prepare the pure phases of the different suboxides (however vide infra). It is important to note, that although the suboxide has a non-stoichiometric composition, it produces a distinct Raman spectrum. The appearance of new peaks in the Raman spectrum of the suboxide (curve B) reflects the appreciable distortion in the $WO_6$ octahedra in this phase. Using an empirical formula described by Hardcastle et al., 1995, it is possible to associate the 870 cm$^{-1}$ mode in curve b with the stretch mode of a 1.78 Å W—O bond. This value compares favorably with the calculated 1.77 Å for one of W—O bondlengths in the $W_3O_8$ structure. The new bands in the W—O bending region (200–400 cm$^{-1}$) are attributed to the fact that each nanowhisker contains at least one of several possible members of the $W_nO_{3n-1}$ homologous series, with different CS distance. The most intense peak in the Raman spectra of $WO_2$ (curve C) appears at 285 cm$^{-1}$, and is assigned to the W—O—W bending mode, which appears in 275 cm$^{-1}$ for $WO_3$ (curve A). Thus, the shift of this band to a higher frequency is attributed to the constrained W—O—W bending in the more compact distorted-rutile structure of $WO_2$. It is also important to note that no Raman bands around 950 cm$^{-1}$, indicative of hydrated clusters, could be discerned.

Hence, the present Raman measurements strongly indicate the formation of partially ordered CS planes in the reduced oxide nanowhiskers (stage II). This superstructure is likely to be an important intermediate stage in the formation of $WS_2$ nanotubes.

Example 2

Synthesis of $WS_2$ Nanotubes (Experiment B)

2a. Experimental Section (i) Synthesis of the $WO_{3-x}$ Particles

Tungsten suboxide particles ($WO_{3-x}$) were produced by heating a tungsten filament (model ME11 from the R. D. Mathis company) in the presence of water vapor inside a vacuum chamber, by the following procedure: once the vacuum in the bell-jar had reached a value of 10$^{-4}$ Torr, the filament was heated for a few minutes in order to remove the superficial oxide layer. Water vapor was then allowed to diffuse into the vacuum chamber through an inlet, until the desired pressure was reached. The filament was heated to around 1600±20° C., while the pressure in the chamber was maintained constant during the evaporation process (a few Torr). After a few minutes of evaporation, a blue powder condensed on the bell-jar walls. The accrued powder consisted of needle-like $WO_{3-x}$ particles (ca. 50 nm in length and 15 nm in diameter) under a specific water vapor pressure.

$NiCl_2$ or $CoCl_2$ ($2 \times 10^{-3}$ M) salts were dissolved in the water reservoir before each evaporation. The nanoparticles produced in the presence of the transition-metal salt appeared to be more crystalline than those obtained without the addition of a salt, as shown by ED (electron diffraction).

(ii) Synthesis of the $WS_2$ Nanotubes Starting from a the $WO_{3-x}$ Nanoparticles The synthesis of the $WS_2$ nanotubes starting from the needle-like $WO_{3-x}$ particles was done in a reactor similar to the one used for the synthesis of IF—$WS_2$ particles (Feldman et a., 1996, 1998). The principle of the synthesis is based on a solid-gas reaction, where a small quantity (5 mg) of $WO_{3-x}$ particles (solid) is heated to 840° C. under the flow of $H_2/N_2$ (forming gas)+$H_2S$ gas mixture. In order to avoid cross-contamination between the different runs and minimize memory effects, which can be attributed to the decomposition of $H_2S$ and deposition of sulfur on the cold walls of the reactor, flushing of the reactor (10 min) with $N_2$ gas flow was performed after each synthesis.

Samples were studied using a scanning electron microscope (SEM) (Philips XL30ESEM FEG), a transmission electron microscope (HEM) (Philips CM 120 (120 keV)) and X-ray diffraction (XRD) (Rigaku Rotaflex RU-200B) having Cu-Kα anode. The electron diffraction (ED) patterns were obtained on a high resolution transmission electron microscope (HRThM) (JEM-4000EX) operated at 400 kV. Ring patterns from TiCl were used as a calibration reference standard for the ED patterns. The accuracy of the d-spacings was estimated at ±0.005 nm.

2 b. Synthesis of Tungsten Oxide Needle-Like Nanoparticles (Stage I)

Three different values of water vapor pressure were selected: $P_{H2O}$=5, 12 and 20 Torr, the latter corresponding to the thermodynamic limit of the water vapor pressure at room temperature (22° C.). The texture of all the batches appeared to be more or less the same after a few minutes of evaporation. However, a variation in the color of the powder, which was collected on the walls of the bell-jar, was noticed. A color range, which goes from dark blue for $P_{H2O}$=5 Torr to light blue for $P_{H2O}$=20 Torr, was observed.

Figure 4A:
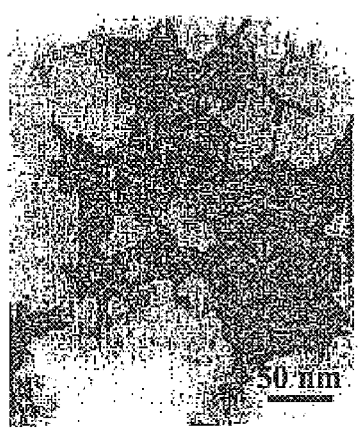
FIGS. 4a–c show TEM micrographs and the corresponding ED patterns of tungsten oxide ($WO_3$) particles synthesized at different water vapor pressures: (a) $P_{H2O}$=5 Torr (scale bar—50 nm); (b) $P_{H2O}$=12 Torr (scale bar—50 nm); (c) $P_{H2O}$=20 Torr (scale bar—20 nm).
Figure 4B:
Figure 4C:

The water vapor pressure in the chamber apparently influences the morphology and the stoichiometry of the nanoparticles obtained by evaporation. For a low value ($P_{H2O}$=5 Torr), the oxide nanoparticles did not have a well-defined morphology (FIG. 4a). The ED pattern confirms that the powder is completely amorphous (not shown). When the pressure was increased ($P_{H2O}$=12 Torr) the nanoparticles presented a cylindrical shape and were crystalline A typical batch is shown in FIG. 4b, where the dimensions of the whiskers are typically around 50 nm in length and 15 nm in diameter. For the thermodynamic limit of the water pressure at room temperature ($P_{H2O}$=20 Torr), a growth in both directions (along the nanoparticle long axis and perpendicular to it) led to the formation of needle-like particles with much smaller aspect ratio and steps perpendicular to the long axis. The whiskers are crystalline as could be evidenced from the ED pattern, which is similar to the one observed for the particles produced at 12 Torr (FIG. 4c).

The stoichiometry of the particles could not be easily assigned by XRD for several reasons. First, most of the samples were not sufficiently crystalline for generating well defined peaks in the spectrum. Moreover, several non-stoichiometric tungsten oxide phases have been reported in the literature and all of them exhibit very similar patterns. Consequently, assigning the stoichiometry of the concerned phase accurately from the XRD data, was rather difficult.

The measurement by electron diffraction of a bundle of individual needle-like crystals was more informative in this case. The values of the $d_{hkl}$ spacings were calculated for the crystalline whiskers synthesized at $P_{H2O}$=12 Torr and at $P_{H2O}$=20 Torr. Both sets of whiskers can be interpreted as having an average substructure similar to that of the reported tetragonal phase $W_{20}O_{58}$ ($WO_{2.9}$) originally described by Glemser et al. (1964) and the results are shown in Table 1. The needles can be described according to a substructure of $WO_3$ interspersed with defects attributable to random crystallographic shear planes occurring either parallel to the needle axis or, alternatively, at some angle to the beam direction as the needles are viewed in the HRTEM. Further evidence of the randomness of the defects occurring in the needles is given by the prominent diffuse streaking that is often observed in ED patterns obtained from these needles (Sloan et al., 1999). It is noteworthy to underline that, whatever the pressure inside the chamber, the batches appeared to be homogeneous in their morphology, providing needle-like particles of relatively constant oxide stoichiometry for a given preparation.

A detailed study of the conditions required for the whisker's growth was then undertaken, the role of the water in this process being examined first.

2c. The Role of Water in the Tungsten Oxide Whisker's Growth

To study the role of water in the oxidation of the tungsten filament, evaporations were performed with oxygen instead of water vapor in the chamber. Indeed, oxidation of the tungsten filament could be performed either with water vapor according to equation 1 below or with pure oxygen according to equation 2, both reactions being exothermic in the conditions of the present measurements (temperature of the filament: 1600±20° C., and pressure in the chamber maintained at 12 Torr). The free energies of the reactions were calculated using the data described in Horsley et. al., 1987, for STP (standard) conditions.

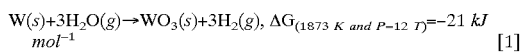

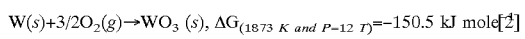

To perform the evaporation with the same quantity of oxygen as for the one performed in the presence of water vapor, the oxygen pressure was maintained at $P_{O2}$=6 Torr compared to $P_{H2O}$=12 Torr ($n_{O2}$=½ $n_{H2O}$). The resultant particles were 100% spherical or faceted, typically 5 to 30 nm in diameter. The color of the powder was light blue, which can be ascribed to a slight reduction of the powder by traces of water still present in the vacuum chamber. When the oxygen pressure was decreased, light blue phases of spherical or faceted nanoparticles were observed as well.

The absence of needle-like particles in presence of oxygen in the chamber is indicative of the role played by hydrogen in generating an asymmetric growth of the nanoparticles (see equations 1 and 2).

These findings allude to the fact that the needle's growth consists of a two-step process occurring simultaneously on the hot filament surface. The first step is the oxidation of the tungsten filament, which leads to the formation of $WO_3$ particles. In the next step, reduction of these particles results in the formation of $WO_{3-x}$ needle-like particles (eq 3).

It is important to note that the direct reaction between water vapor and the W filament is not the only plausible oxidation route. Indeed two pathways could be contemplated for the oxidation of W with water. The first one corresponds to the direct reaction of water molecules with W atoms (eq 1). Alternatively, partial water decomposition (see eq 4) leads to the oxidation of the hot tungsten filament by liberated oxygen.

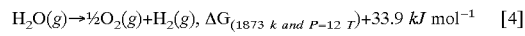

Regardless of whether the direct or indirect mechanism is correct, $H_2$ is a resultant product of both reactions. It is therefore believed that hydrogen is involved in the production of needle-like particles as opposed to the spherical ones, which are obtained in the absence of hydrogen in the chamber.

2d. Increasing the Needle-Like Tungsten Oxide Particle Length Via High Temperature Reaction (Stage II)

Since hydrogen was found to be indispensable for the growth of the needles (see 2c above), an alternative procedure for promoting their growth under more controllable conditions was pursued. The basic idea was to promote the uniaxial growth of the short tungsten suboxide needles obtained in stage I under very low hydrogen gas concentration. For that purpose, the needles were placed in a reactor operating at around 840° C. in a flow, of ($H_2/N_2$) gas mixture where the concentration of hydrogen was progressively increased to 1% (stage II). It was believed that the separation between the two reactions, i.e. formation of the needle-like germs in the first place and their subsequent growth, would afford a better control of the process, enabling more uniform whiskers to be derived.

Experiments were performed with the three types of particles synthesized in Example 2b above in stage I by evaporation at: $P_{H2O}$=5, 12 and 20 Torr. The results are summarized in Table 2a. The first point to emphasize is that the two sets of short needle-like particles (evaporated at $P_{H2O}$=12 and 20 Torr) in contact with the gas mixture (1% $H_2$/99% $N_2$) are transformed into long tungsten oxide nanowhiskers (several microns in length) at 840° C. This is quite a large elongation considering the fact that the starting material consists of oxide needles that are usually no longer than 50 nm. Moreover, the amorphous oxide nanoparticles, which are shapeless ($P_{H2O}$=5 Torr), are also converted into very long whiskers. Consequently, the starting needle-like morphology is apparently not relevant for inducing the growth of very long oxide whiskers during the annealing (stage II). Indeed, it can be summarized that the lesser the crystallinity of the precursor (tungsten suboxide) particles, the thinner and longer are the microlength oxide nanowhiskers obtained after stage II annealing. The most likely explanation for this observation would be that a sublimation of a part of the tungsten suboxide particles is followed by a transport of the clusters in the gas and their condensation on some other tungsten suboxide particles, which did not sublime. For example, amorphous nanoparticles smaller than say 5 nm are likely to be more volatile than the larger nanoparticles (Ostwald ripening), a point discussed in greater detail hereinbelow.

The second point to underline is the influence of the gas flow-rate (F) on the morphology of the particles, which is equivalent to a change in the pressure, (especially the partial pressure of hydrogen). This is particularly well illustrated in the series of measurements done with the particles synthesized at $P_{H2O}$=12 Torr. In that case, a low flow-rate (55 cm$^3$ min$^{-1}$) generates spherical particles while a higher one ($\geq$110 cm$^3$ min$^{-1}$) brings about the growth of long nanowhiskers. The trend is the same whatever the starting tungsten suboxide precursor. The flow-rate also influences the thickness of the particles, as shown by the experiment performed with the precursor synthesized at $P_{H2O}$=5 Torr. Indeed, in the particular case where the limit of the flow-rate allowed by the equipment was reached (300 cm³ mind), a majority of thin oxide nanowhiskers (10–20 nm in diameter) were observed instead of the usual mixture of thin and thick nanowhiskers (diameters up to 100 rim).

Since the amount of the starting oxide whiskers used for each experiment was quite similar from one batch to another (≅5 mg), the differences observed by changing the flow-rates could be attributed to either of two parameters: the partial flow-rate of hydrogen in the reactor (partial pressure of hydrogen) or the total gas flow-rate (total pressure). This point is particularly well expressed by the experiment performed with the particles synthesized at $P_{H2O}$=12 Torr (stage I) and fired under a gas flow-rate of 55 cm³ min⁻¹ (stage 1I). In that case, whatever the formation mechanism, the flow is so slow that spherical or faceted nanoparticles are formed. Even the original needle-like morphology is not preserved in such circumstances. Note also that the gas flow-rate may influence the apparent temperature of the gas mixture.

It can thus be concluded that the higher the flow-rate, the higher is the driving force to generate long and thin oxide nanowhiskers.

The morphology of the oxide whiskers obtained after annealing the particles evaporated at $P_{H2O}$=20 Torr are pretty different from the previous results, since the length and the thickness appear to be systematically limited to approximately one 20 micron and 50–100 nm, respectively. These results indicate that, in such a case, the initial thickness and perhaps the degree of crystallinity of the, needle-like nanoparticles dictates the final thickness of the elongated nanowhisker after annealing. Particular regard should be paid to the apex of these whiskers as they routinely formed perfect ninety-degree heads following annealing. This head morphology excludes a vapor-liquid-solid (VLS) growth mode as a plausible growth mechanism.

2e. Influence of the Hydrogen Concentration on the Elongation Process of the Tungsten Oxide Whiskers This point was tested by varying the hydrogen concentration in the gas mixture. Indeed, by adding extra $N_2$ gas, the hydrogen concentration was diluted from 1% to approximately 0.2%, keeping the total flow-rate constant. The annealing experiments (stage 1I) were performed with the precursor synthesized at $P_{H2O}$=12 Torr (stage I). These results are shown in Table 2b.

The first noticeable observation is that the morphology of the resultant particles of two different batches annealed at the same total flow-rate ($F_{Tot}$) but at a different partial flow-rate of $H_2$ ($F_{H2}$), is different. In parallel, for two experiments, in which annealing was done with the same value of Fm but with two different values of the total flow-rate (i.e. by varying the nitrogen gas flow-rate), a slight morphological difference was observed. It is evident that both parameters ($F_{H2}$ and $F_{Tot}$) influence the morphology of the particles (stage II), as it was previously found for the case of the tungsten filament evaporated in contact with water vapor in the chamber (stage I).

Besides this consideration, it is important to note that this set of experiments in was also a useful means of determining the minimum concentration of hydrogen required for providing the elongation of the whiskers. Globally, it appears that decreasing the concentration of hydrogen to 0.2% did not change drastically the morphology of the particles, which consists of long oxide whiskers >1 μm (Table 2b). It is noteworthy to underline the fact that the hydrogen concentration should be adjusted for the given amount of WO particles. Indeed, the ratio between the quantities of hydrogen and the starting $WO_{3-x}$ powder must be kept constant in order to get the same kind of morphology during the annealing (stage II).

From this last experiment it emerges that a low concentration of hydrogen (0.0%) is sufficient for inducing the elongation process of the oxide whiskers. Furthermore, it suggests that the sublimed phase involved in the process has a stoichiometry very close to the one of the starting precursor ($WO_{2.9}$).

As a conclusion of these experiments, two key parameters for inducing the oxide whisker's growth can therefore be discerned during stage II annealing: the total gas flow ($P_{Tot}$) and the partial flow of hydrogen ($PH_2$). These two factors are probably involved in the synthesis of the $WS_2$ nanotubes as well, starting from the short $WO_{3-x}$ whiskers.

2f. Synthesis of $WS_2$ Nanotubes Starting from the Short Oxide Whisker Precursor (Stages I+III)

The main process of the WS nanotubes synthesis consists of sulfidizing the tungsten suboxide powder in a gas mixture which is composed of $H_2/N_2$ and $H_2S$, where $H_2$ plays the role of the reducer and $H_2S$ is the sulfidizing agent according to equation 5 (stage III):

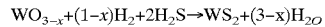

$$WO_{3-x}+(1-x)H_2+2H_2S \rightarrow WS_2+(3-x)H_2O \qquad [5]$$

Since the growth process of the sulfide proceeds from outside in, sulfur atoms have to cross the already existing compact layers of sulfide and therefore the oxide to sulfide conversion is diffusion controlled. In this way, after a few hours of reaction, all the W—O bonds of the starting material are converted into W—S bonds, leading to hollow structures without a substantial morphological change. Furthermore, since the density of $WO_3$ (ρ=7.16 g. cm³) and $WS_2$ (ρ=7.5 g. cm³) are quite similar, the original structure of $WO_3$ (and therefore $WO_{3-x}$) is preserved throughout the reaction as was the case for the IF nanoparticles starting with quasi-spherical particles of $WO_3$.

Short $WO_{3-x}$ needle-like particles, produced by evaporation at $P_{H2O}$=12 Torr in stage I, were placed in a reducing/sulfidizing atmosphere as described previously. In order to understand which factors are responsible for the morphology of the converted sulfidized samples, only one parameter amongst three was changed at a time: the flow-rates of $H_2/N_2$; $H_2S$ and the hydrogen concentration in the gas mixture. In all these experiments the temperature was maintained at 840° C. The data from these experiments are summarized in Table 3. Each Table (3a, 3b and 3c) contains experiments in which one parameter was changed at a time. Comparisons could therefore be done inside each set of experiments and between them.

Figure 5:
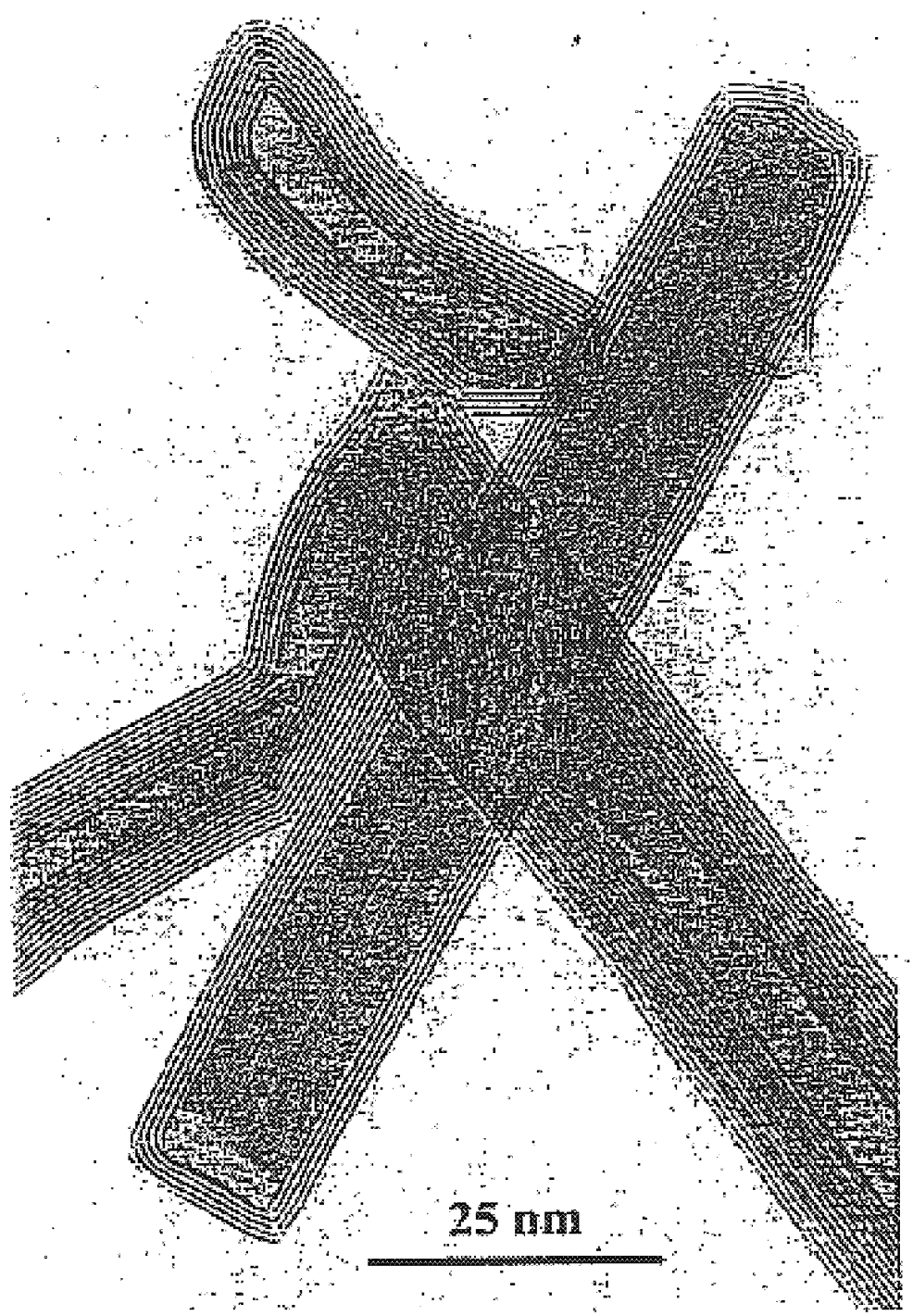
FIG. 5 shows TEM micrograph of "short" WS nanotubes with oxide in the core.

When a gas mixture with 5% hydrogen was used (Table 3a), most of the needle batches had similar morphologies irrespective of the flow-rate ratio ($F_{H2/N2}/F_{H2S}$). A TEM picture of a typical bundle of short nanotubes stemming from those batches is presented in FIG. 1b and FIG. 5. The particles are hollow (FIG. 1b) or with some remaining oxide (FIG. 5) and the $WS_2$ layers contain very few defects. The apexes of the tubes are quite perfectly closed. The elongation of the $WO_{3-x}$ precursors (50 nm in length and 15 nm in diameter). is not very pronounced in this case. In contrast, when the ratio $F_{H2}/F_{H2S}$ was very high, long nanotubes of several microns in length could be discerned in the samples amongst bundles of short nanotubes. However, the formation of long nanotubes was always accompanied by the presence of metallic tungsten in their cores and, in several cases, spherical nanoparticles of tungsten were found. Also, the number of $WS_2$ layers was rather small in this case. This is attributed to fast reduction of the tungsten oxide core to the pure metal and subsequently to the slow diffusion of sulfur through the compact metallic core (Margulis et al., 1993). Furthermore, a wide size-distribution amongst the long nanotubes was found. Indeed, in such conditions, two types of nanotubes were present: "thin nanotubes", with a typical diameter of about 20 nm and the "thick" ones, which could reach a diameter up to 100 nm.

The variety of morphologies which appear by varying the flow-rate of forming gas ($H_2/N_2$) and $H_2S$ shows that the ratio between the two gases is essential for determining the final shape of the sulfidized nanotubes.

More precisely, when the ratio $F_{H2}/F_{H2S}$ exceeds the value of ca. 10, either tungsten particles or nanotubes containing a tungsten core, start to appear. In that case, the hydrogen concentration in the reactor is so high compared to that of sulfur (for the amount of precursor taken), that the tungsten suboxide particles ($WO_{3-x}$) are reduced almost instantaneously into tungsten. This is another manifestation of the competition which occurs between the reduction and the sulfidization processes. To avoid such an unwieldy situation, one has to operate in a specific ratio with $F_{H2}/F_{H2S}<10$. When the concentration of $H_2$ in the forming gas was about 5%, short nanotubes were produced in the range $1.4 \leq F_{H2}/F_{H2S} \leq 11$ (FIG. 5) and long ones were observed for a ratio $F_{H2}/F_{H2S}$ above 11 (not shown).

Another aspect for the influence of the flow-rate ratio $F_{H2}/F_{H2S}$ on the nanotubes morphology is illustrated in the experiments where no $H_2S$ was added to the system at all. In this case, the reactor was not flushed with $N_2$ prior to the experiment. Here traces of sulfur, which remained on the reactor walls from the previous experiment, led to the formation of long nanotubes (Table 3a). This point emphasizes the fact that the ratio $F_{H2}/F_{H2S}$ is essential for the final morphology of the sulfidized particles.

Figure 6A:
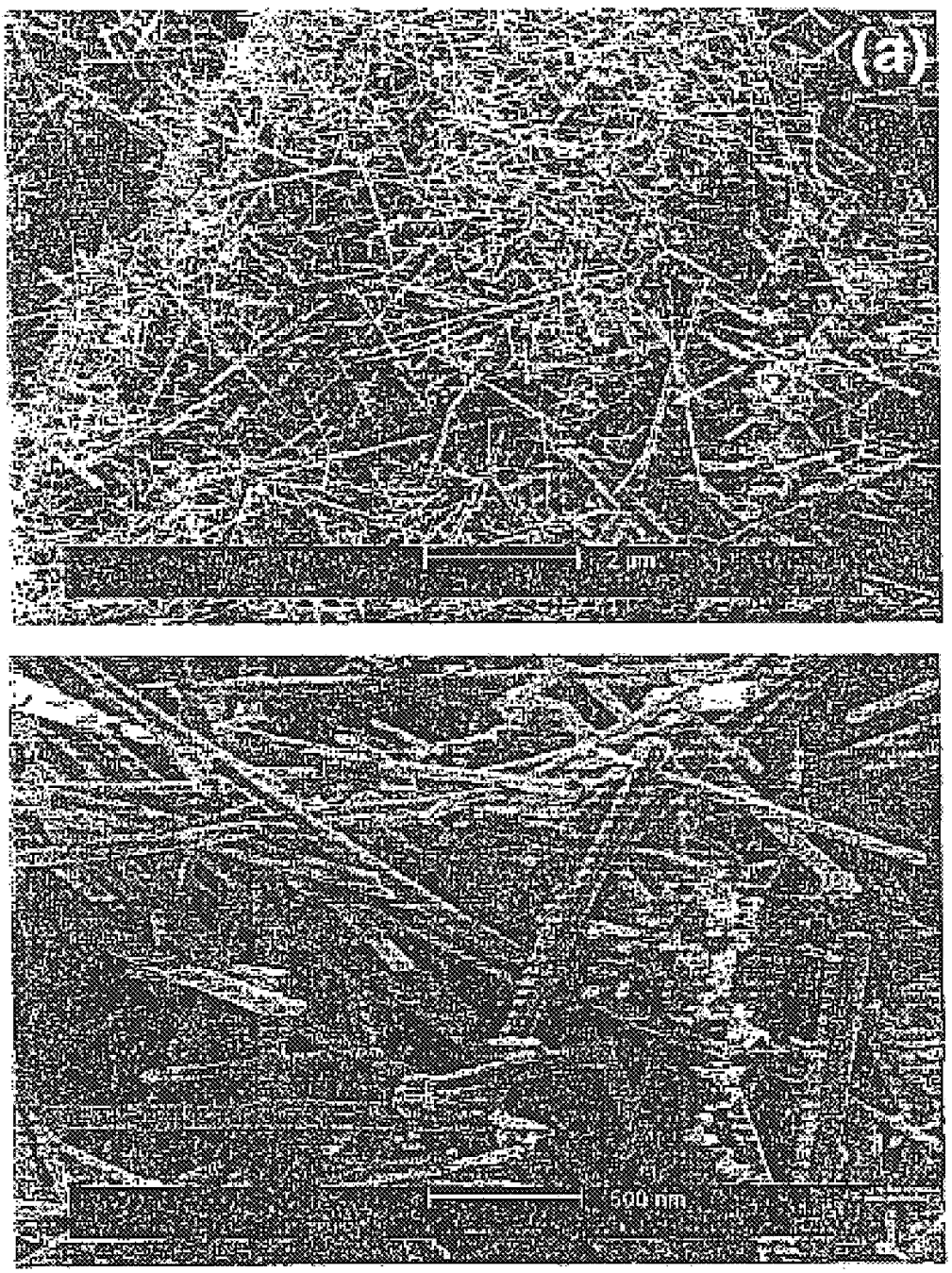
FIG. 6a shows SEM micrographs of long hollow or oxide-free WS, nanotubes at two different magnifications (upper figure—2 μM; lower figure—500 nm).
Figure 6B:
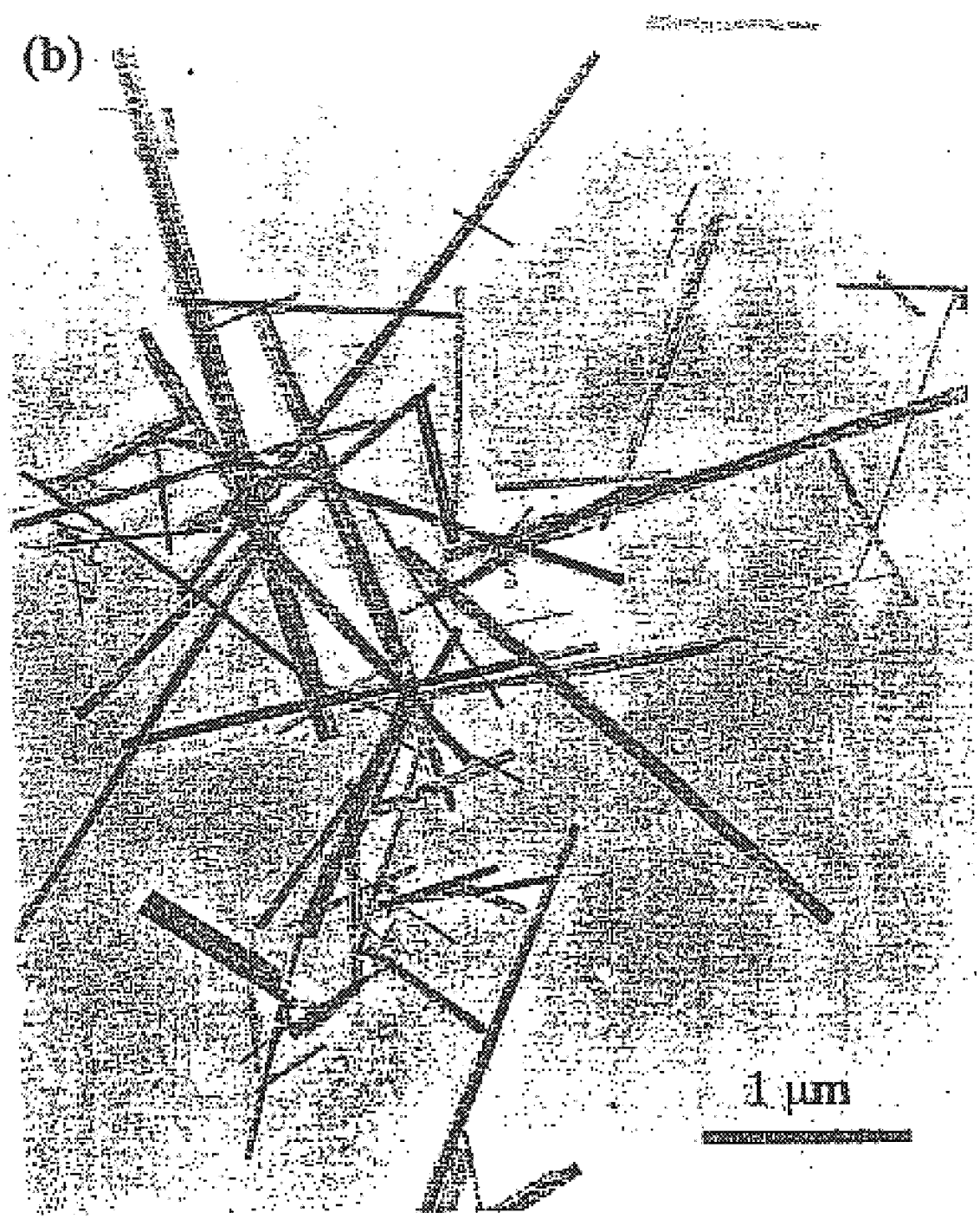
FIG. 6b shows TEM micrograph of long WS nanotubes (scale bar—1 μm).

When the hydrogen concentration in the forming gas was lowered to 1% instead of 5%, the factor $F_{H2}/F_{H2S}$ appeared not to be the only one responsible for the morphological changes. Indeed, two different batches, for which the ratio $F_{H2}/F_{H2S}$ was kept constant (Table 3b: batches 3 and 6), gave two discernable morphologies. Besides that careful examination of the data revealed that, decreasing the hydrogen concentration in the gas mixture leads frequently to the formation of long nanotubes instead of the usual short ones. This trend was even more pronounced in experiments performed with an extremely low hydrogen concentration (less than 1%—see Table 3c). As a matter of fact, all the batches performed with hydrogen concentration below 1%/o led to the growth of either a mixture of short and long nanotubes (not shown) or to almost pure phases of long nanotubes (see FIGS. 6a, 6b). The results of Table 3 lead to the conclusion that the appearance of long nanotubes depends on the ratio between the flow-rate of hydrogen and the total flow-rate of gases ($F_{H2}/F_{Tot}$).

It emerges therefore, that in order to achieve the formation of long nanotubes, two flow-rate ratios have to be carefully controlled: the ratio $F_{H2}/F_{H2S}$ and $F_{H2}/F_{Tot}$. The conditions required for providing long nanotubes as a majority phase in a reproducible manner are consequently the following:

$$0.5 \leq F_{H2}/F_{H2S} \leq 4.5 \text{ and } 0.002 \leq F_{H2}/F_{Tot} \leq 0.007$$

To obtain homogeneous phases consisting of purely long nanotubes without tungsten in their core, the conditions are even more restrictive:

$$1 \leq F_{H2}/F_{H2S} \leq 2.2 \text{ and } 0.005 \leq F_{H2}/F_{Tot} \leq 0.007$$

It emerges from all these results that a careful control of the synthesis parameters leads to a specific and desireable morphology of the nanotubes.

2g. Synthesis of $WS_2$ and $WSe_2$ Nanotubes Starting with the Elongated Oxide Whiskers (Stages I+II+III)

Figure 7A:
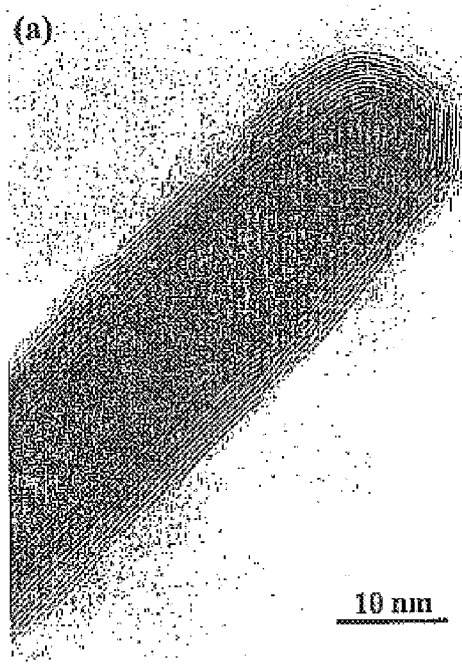
FIG. 7 shows TEM micrographs of: (7a) apex of one $WS_2$ nanotube synthesized by the "tree-step method"; (7b) nanotube walls, which contain several defects.
Figure 7B:
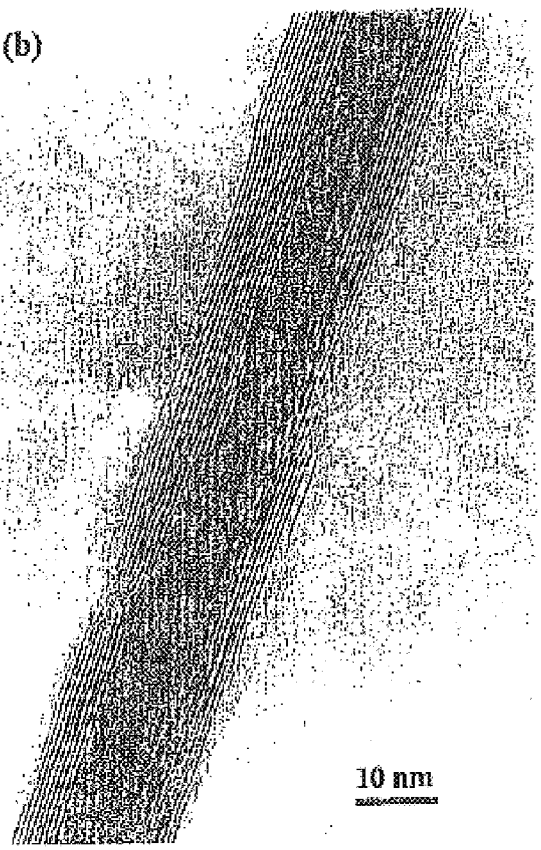

The purpose of this last study was to explore the possibility to synthesize long $WS_2$ nanotubes from the already existing long oxide nanowhiskers obtained in stage II. The long oxide nanowhiskers synthesized from the short whiskers (see Example 2b above) were placed in a reducing and sulfidizing atmosphere without taking specific attention to the ratios $F_{H2}/F_{H2S}$ and $F_{H2}/F_{Tot}$. All the attempts led to the formation of long nanotubes, although the degree of crystallinity of the nanotubes was not perfect. The WS layers contained plenty of defects (FIGS. 7a, 7b) and rather quite large proportion of the nanotubes was not totally closed at their apex (not shown).

The two-step method of the invention may be more difficult to control, but it gives very satisfactory results. The three-step method of the invention lends itself to the synthesis of nanotubes from related compounds, such as $WSe_2$ or mixed $WS_2WSe_2$ using preprepared long oxide nanowhiskers as a precursor.

Indeed, $WSe_2$ nanotubes were prepared by heating selenium ingot at 350° C. downstream of the main reactor, which was heated to 760° C. Forming gas (1% $1H_2/99\%$ $N_2$-l 10 $cm^3$ mini) was provided in this case. The resulting $WSe_2$ nanotubes were quite perfect in shape.

Example 3

Growth of the $WS_2$ Nanotubes in the Two-Step Process

Figures 8A, 8B, 8C:
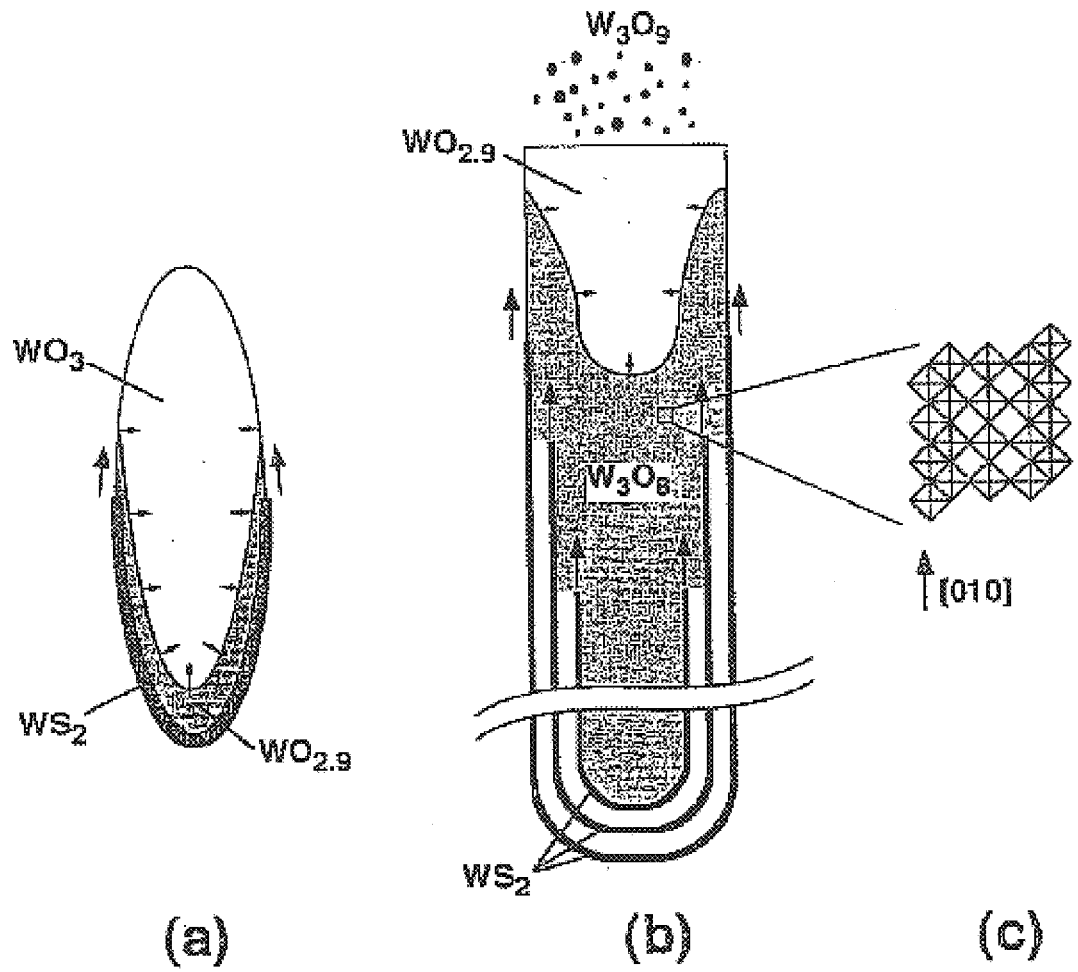
FIGS. 8A–8C depict a schematic illustration of the growth process of the encapsulated sulfide/oxide nanowhisker. 8A. Initialization of the sulfidization process of the asymmetric oxide nanoparticle; 8B. Growth of a long sulfideloxide encapsulated nanowhisker. 8C. [010] is the growth axis of the oxide whiskers.

From the present measurements, one can visualize the growth process of the encapsulated nanowhisker as depicted in FIG. 8. At the first instant of the reaction (FIG. 8A), the asymmetric tungsten oxide nanoparticle reacts with $H_2S$ and forms a protective tungsten disulfide monomolecular layer, prohibiting coalescence of this nanoparticle with neighboring oxide nanoparticles. Simultaneous condensation of $(WO_3)_n$ or $(WO_{3-x} \cdot H_2O)_n$ clusters on the nanowhisker tip and reduction by hydrogen gas leads to growth of the sulfide-coated oxide nanowhisker. This process is schematically illustrated in FIG. 8B. Note that during the gradual reduction of the oxide core, the CS planes in the oxide phase rearrange and approach each other until a stable oxide phase $W_3O_8$ is reached (Iguchi, 1978). In FIG. 8C, [010} is the growth axis of the $W_3O_8$ whiskers. This phase provides a sufficiently open structure for the sulfidization to proceed until the entire oxide core is consumed. Further reduction of the oxide core would bring the sulfidization reaction into a halt (Margulis et al., 1993). Therefore, the encapsulation of the oxide nanowhisker, which tames the reduction of the core, allows for the gradual conversion of this nanoparticle into a hollow WS nanotube.

Naturally, the elongation of the oxide nanowhiskers requires a reservoir of $(WO_3)_n$ clusters in the vapor phase. Conceivably, the vaporized oxide clusters react only very slowly with the $H_2$ and $H_2S$ gases, which would otherwise hamper the rapid growth of the oxide nanowhisker. The termination of the nanowhisker growth occurs when the source of tungsten oxide is depleted and the vapor pressure of the oxide clusters diminishes below a critical value. In this case the simultaneous reaction of tip growth/reduction and sulfidization cannot be maintained and the outer sulfide layer of the encapsulate completely enfolds the oxide tip. In fact, this is the reason that the $WS_2$ nanotubes are almost the sole phase comprising the mat of FIGS. 2 and 6. This mechanism entails that part of the oxide nanoparticles predominantly elongate through tip growth, while the rest of the oxide nanoparticles furnish the required vapor pressure for the tip growth of the former population, and they slowly diminish in size (Ostwald ripening). The oxide vapor can not condense and stick onto the sulfide wall of the encapsulated nanowhiskers and therefore no thickening of the nanotubes or their bifurcation, is observed.

Example 4

WS$_2$ Nanotubes as Tips for Scanning Probe Microscopy

WS$_2$ nanotubes were attached to microfabricated tips of an atomic force microscope (AFM) by transferring adhesive from carbon tape to a Si tip, then pulling off nanotube bundles with this tip from a mat of nanotubes prepared on a different area of the tape (Dai et al., 1996). A portion of this mat was glued to the Si tip, of which the longest nanotube served now as the new tip. Scans on a Ti tip calibrator (Westra et al., 1995) and subsequent blind reconstruction (using algorithm developed by A. Efimov, obtainable at http://www.siliconmdt.com) of tip shape gave tip width of 16 nm for the last 100 nm of the tip length. In order to demonstrate the capabilities of these tips for investigating deep and narrow structures, they were used to image a line structure of depth 670 nm and varying linewidth. As seen in FIG. 9, the nanotube tips perform significantly setter than microfabricated sharp Si tips. While the WS$_2$ nanotube tip follows the contour of even the finest replica and reaches its bottom, the commercial Si tip is unable to delineate the replica correctly due to its slanted edge. Also, the Si tip is unable to follow the sample contour very smoothly (see for example FIG. 9C), because the surface of this tip is not passivated and therefore strong interaction with the substrate at close proximity is unavoidable. Thinner or single walled nanotubes may not be useful for such applications because of their small spring constant toward bending. Also, due to its sandwich S—W—S structure, the WS$_2$ nanotubes are probably stiffer than their carbon analogs. In contrast to carbon nanotubes, the present nanotubes can be easily sensitized by visible and infra-red light and therefore show promise as a selective probe for nanophotolithograpby.

REFERENCES

1. Ajayan, P. M.; Stephin, O.; Redlich, Ph.; Colliex, C. *Nature* 1995, 375, 564.
2. Chopra, N. G.; Luyken, R J.; Cherrey, K.; Crespi, V. H.; Cohen, M. L.; Louie, S. G.; Zettl, A. *Science* 1995, 269, 966.
3. H. Dai, J. H. Hafaer, A. G. Rinzier, D. T. Colbert, R. E. Smalley, *Nature* 1996, 384, 147. See also, J. H. Hafler, "Nanotube tips for SFM", http://cnst.rice.edu/mountlhtml.
4. Feldman, Y.; Wasserman, E.; Srolovitz, D.; Tenne, R. *Science* 1995, 267, 222.
5. Feldman, Y.; Frey, G. L.; Homyonfer, M.; Lyakhovitskaya, V.; Margulis, L. Cohen, H.; Hodes, G.; Hutchison, J. L. and Tenne, R. *J. Am. Chem. Soc.* 1996, 118, 5362.
6. Y. Feldman, V. Lyakhovitskaya, R. Tenne, *J. Am. Chem. Soc.* 1998, 120, 4176.
7. G. L. Frey, R. Tenne, M. J. Matthews, M. S. Dresselhaus, G. Dresselhaus, *J. Mater. Res.* 1993, 13, 2412.
8. Glemser, O.; Weidelt, J.; Freund, F. *Z. Anorg. Allg. Chem.* 1964, 332, 299.
9. F. D. Hardcastle, I. E. Wachs, *J. Raman Spectrosc.* 1995, 26, 397.
10. Hershfinkel, M.; Gheber, L. A.; Volterra, V.; Hutchison, J. L.; Margulis, L.; and Tenne, R. *J. Am. Chem. Soc.* 1994, 116, 1914.
11. J. A. Horsley, I. E. Wachs, J. M. Brown, G. H. Via, F. D. Hardcastle, *J. Phys. Chem.* 1987, 91, 4014.
12. E. Ieuchi, *J. Solid State Chem.,* 1978, 23, 231.
13. Iijima, S. *Nature* 1991, 56, 354.
14. Margulis, L.; Salitra, G.; Talianker, M.; Tenne, R. *Nature* 1993, 365, 113.
15. T. Miyano, M. Iwanishi, C. Kaito, M. Shiojiri, *Jap. J. Appl. Phys.* 1983, 22, 863.
16. Remskar, M.; Skraba, Z.; Cleton, F.; Sanjines, R.; Levy, F. *Appl. Phys. Lett.* 1996, 69, 351.
17. Remskar, M.; Skraba, Z.; Regula, M.; Ballif, C.; Sanjines, R. and Levy, F. *Adv. Mater.* 1998, 10, 246.
18. Remskar, M.; Skraba, Z.; Ballif, C.; Sanjines, R.; Levy, F. *Surf Sci.*1999a, 435, 637.
19. Remskar, M.; Skraba, Z. *Appl. Phys. Lett.* 1999b, 74, 3633.
20. Sloan, J.; Hutchison, J. L.; Tenne, R.; Feldman, Y.; Tsirlina, T.; Homyonfer, M. *J. Solid State Chem.* 1999, 144, 100.
21. Tenne, R.; Margulis, L.; Genut, M. and Hodes, G. *Nature* 1992, 360, 444.
22. Kl. Westra, D. J. Thomson, *J. Vac. Sci. Technol.* 1995, B 13, 344. Obtainable from General Microdevices, Edomonton, Alberta, Canada.
23. Zelenski, C. M.; Dorbout, P. K. *J. Am. Chem. Soc.* 1998, 120, 734.

Table 1. Comparative d-spacing data between the needle-like precursors and the tetragonal WO$_{2.9}$ reported by Glemser et al. 1964. The $d_{hkl}$-spacings were obtained from the ED ring pattern of the oxide particles. A TiCl pattern was used as a standard reference.

| Oxide precursors | | Tetragonal WO$_{2.9}$ | | |
|---|---|---|---|---|
| Irel | $d_{hkl}$ (Å) | Irel | $d_{hkl}$ (Å) | hkl |
| 100 | 3.752 | 100 | 3.74 | 110 |
| 20 | 3.206 | 20 | 3.10 | 101 |
| 80 | 2.640 | 80 | 2.65 | 200 |
| 30 | 2.184 | 30 | 2.20 | 201 |
| — | | 10 | 2.02 | 211 |
| 30 | 1.878 | 30 | 1.88 | 220 |
| 10 | 1.703 | 10 | 1.78 | 300 |
| 60 | 1.558 | 60 | 1.67 | 310 |
| 50 | 1.153 | 50 | 1.53 | 311 |
| — | | 10 | 1.33 | 222 |
| — | | 10 | 1.25 | 330 |
| — | | 10 | 1.17 | 322 |

Table 2. Influence of the hydrogen concentration on the morphology of the particles: (a) mixture of 1% H$_2$/99% N$_2$. (b) mixture of gases with less than 1% H$_2$ in the overall gas mixture. LO$_{ox-T}$ denotes long oxide whiskers, which are thick (D up to 100 nm). L$_{ox-t}$ denotes long oxide whiskers, which are thin (D≅10–20 nm). S denotes spherical particles. F denotes faceted particles.

TABLE 2a

| P$_{H2O}$ (Torr) | Flow 1% H$_2$/99% N$_2$ (cm$^3$ min$^{-1}$) | Morphology of the particles |
|---|---|---|
| 5 | 110 | L$_{ox-t}$ & L$_{ox-T}$ (>1 μm) |
| 5 | 200 | L$_{ox-t}$ & L$_{ox-T}$ (>>1 μm) |
| 5 | 300 | L$_{ox-t}$ >> L$_{ox-T}$ (>>1 μm) |
| 12 | 55 | S + F |
| 12 | 110 | L$_{ox-t}$ & L$_{ox-T}$ (>>1 μm) |
| 12 | 200 | L$_{ox-t}$ & L$_{ox-T}$ (>>1 μm) |

TABLE 2a-continued

| $P_{H2O}$ (Torr) | Flow 1% $H_2$/99% $N_2$ (cm³ min⁻¹) | Morphology of the particles |
|---|---|---|
| 20 | 110 | $L_{ox-T} \gg L_{ox-t}$ ($\approx 1\ \mu m$) |
| 20 | 200 | $L_{ox-T} \gg L_{ox-t}$ ($\approx 1\ \mu m$) |

TABLE 2b

| $P_{H2O}$ (Torr) | Flow 1% $H_2$ (cm³ min⁻¹) | Flow $N_2$ (cm³ min⁻¹) | $F_{tot}$ (cm³ min⁻¹) | $F_{H2}$ (cm³ min⁻¹) | % $H_2$ = $F_{H2}/F_{tot}$ | Morphology of the particles |
|---|---|---|---|---|---|---|
| 12 | 110 | 100 | 210 | 1.1 | 0.52 | $L_{ox-t}$ & $L_{ox-T}$ ($\gg 1\ \mu m$) |
| 12 | 200 | 100 | 300 | 2 | 0.73 | $L_{ox-T} \gg L_{ox-t}$ ($\approx 1\ \mu m$) |
| 12 | 200 | 50 | 250 | 2 | 0.88 | $L_{ox-t}$ & $L_{ox-T}$ ($\gg 1\ \mu m$) |
| 12 | 200 | 20 | 220 | 2 | 1 | $L_{ox-t}$ & $L_{ox-T}$ ($\gg 1\ \mu m$) |
| 12 | 100 | 200 | 300 | 1 | 0.33 | $L_{ox-t}$ & $L_{ox-T}$ ($\gg 1\ \mu m$) |
| 12 | 50 | 200 | 250 | 0.5 | 0.2 | $L_{ox-T} \gg L_{ox-t}$ ($\approx 1\ \mu m$) |

Table 3. Influence of the flow-rate of the gases and the ratio between them on the morphology of the sulfidized samples for different concentrations of hydrogen in the gas mixture: (a) 5% $H_2$/95% $N_2$. (b) 1% $H_2$/99% $N_2$. (c) less than 1% $H_2$/99% $N_2$. All measurements have been done with the starting $WO_{3-x}$ precursor produced at $P_{H2O}$=12 Torr. Sh and L denote short and long nanotubes, respectively. $L_T$ long and thick nanotubes and $L_t$ long and thin nanotubes. * synthesis done without addition of $H_2S$ but with residual sulfur from the previous synthesis.

TABLE 3a

| Flow of 5% $H_2$/95% $N_2$ (cm³ min⁻¹) | Flow of $H_2S$ (cm³ min⁻¹) | $F_{H2}/F_{H2S}$ | $F_{H2/N2}/F_{H2S}$ | Morphology of the samples |
|---|---|---|---|---|
| 110 | 4 | 1.375 | 27.5 | Sh |
| 110 | 2 | 2.75 | 55 | Sh |
| 110 | 1 | 5.5 | 110 | Sh |
| 110 | 0.5 | 11 | 220 | Sh with W inside |
| 110 | 0* | | | $L_T$ with W inside + W |
| 200 | 2 | 5.5 | 110 | Sh |
| 200 | 1 | 10 | 200 | Sh with W inside |
| 200 | 0.5 | 20 | 400 | ($L_t$ & $L_T$ + Sh) with W inside |
| 55 | 2 | 1.375 | 27.5 | Sh |

TABLE 3b

| Flow of 1% $H_2$/99% $N_2$ (cm³ min⁻¹) | Flow of $H_2S$ (cm³ min⁻¹) | $F_{H2}/F_{H2S}$ | $F_{H2/N2}/F_{H2S}$ | Morphology of the samples |
|---|---|---|---|---|
| 110 | 2 | 0.55 | 55 | Sh + 2H-$WS_2$ |
| 110 | 1 | 1.1 | 110 | Sh +$L_t$ & $L_T$ + IF + 2H-$WS_2$ |
| 110 | 0.5 | 2.2 | 220 | Sh |
| 110 | 0.3 | 3.7 | 314 | Non defined shape + IF + Sh |
| 200 | 2 | 1 | 100 | Bad encapsulation |
| 200 | 1 | 2 | 200 | Sh + very few L + IF + 2H-WS2 |
| 200 | 0.5 | 4 | 400 | (Sh + $L_t$ & $L_T$ + IF) with W inside |
| 55 | 2 | 0.275 | 27.5 | 2H-$WS_2$ |

TABLE 3c

| Flow of 1% $H_2$/99% $N_2$ (cm³ min⁻¹) | Flow of $N_2$ (cm³ min⁻¹) | Flow of $H_2S$ (cm³ min⁻¹) | $F_{H2}/F_{H2S}$ | % $H_2$ = $F_{H2}/F_{tot}$ | Morphology of the samples |
|---|---|---|---|---|---|
| 200 | 100 | 1 | 2 | 0.66 | Sh + $L_t$ |
| 110 | 100 | 1 | 1.1 | 0.52 | Sh + $L_t$ |
| 100 | 200 | 1 | 1 | 0.33 | Sh with W inside + $L_t$ & $L_T$ |
| 50 | 200 | 1 | 0.5 | 0.2 | Sh + $L_t$ |
| 100 | 200 | 0.5 | 2 | 0.33 | (Sh + $L_t$ & $L_T$) with W inside |
| 110 | 100 | 0.5 | 2.2 | 0.52 | $L_T$ & $L_t$ + Sh |
| 200 | 100 | 0.5 | 4 | 0.66 | $L_T$ & $L_t \gg$ Sh with W inside |
| 200 | 100 | 2 | 1 | 0.66 | $L_t$ & $L_T \gg$ Sh |
| 110 | 100 | 2 | 0.55 | 0.52 | Sh $\gg$ 2H-$WS_2$ |

What is claimed is:

1. A method for bulk synthesis of long nanotubes of a transition metal chalcogenide from a transition metal material, water vapor and $H_2X$ gas or $H_2$ gas and X vapor, wherein X is S, Se or Te, comprising:
   a) either heating a transition metal material in the presence of water vapor in a vacuum apparatus or evaporating a transition metal material in the presence of water vapor by an electron beam, at a suitable pressure, to obtain nanoparticles of the transition metal oxide;
   b) elongating the transition metal oxide nanoparticles of step (a); and
   c) annealing the transition metal oxide nanoparticles obtained in step (b) in a reducing atmosphere with a $H_2X$ gas or $H_2$ gas and X vapor, wherein X is S, Se or Te, at a suitable temperature, thus obtaining long nanotubes of the transition metal chalcogenide.

2. A method according to claim 1, wherein the elongation of the transition metal oxide nanoparticles is carried out by heating the oxide under reducing conditions for a few minutes, or by electron beam irradiation of the oxide in high vacuum conditions.

3. A method according to claim 2, wherein said reducing conditions consist in heating the oxide nanoparticles under the flow of a gas comprising from 0.05 to 1% $H_2$ and from 99.95 to 99% $N_2$ at a flow rate of 110 ml per minute for up to 10 minutes.

4. A method according to claim 1 for the synthesis of long nanotubes of a mixture of transition metal chalcogenides, wherein the annealing step is carried out by alternating the annealing atmosphere of $H_2X$ gas or of $H_2$ gas and X vapor.

5. A method according to claim 4, wherein the chalcogenides are sulfides and selenides and the annealing step is carried out by alternating the annealing atmosphere of $H_2S$ and $H_2Se$ gas or of $H_2$ gas and S and Se vapor.

6. A method according to claim 1, wherein the reducing atmosphere for annealing the oxide nanoparticles includes chalcogenation, under the flow of a gas comprising 1% $H_2$ and 99% $N_2$ at a flow rate of about 110 ml/min, and $H_2X$ at a flow rate of about 1 ml/min.

7. The method according to claim 1, wherein said transition metal is selected from the group consisting of Mo, W, V, Zr, Hf, Pt, Re, Nb, Ta, Ti, and Ru.

8. The method according to claim 1, wherein the nanotubes obtained are 0.2–20 micron long.

9. The method according to claim 1, for bulk synthesis of long nanotubes of $WS_2$ and/or $WSe_2$ which comprises:

a) either heating W in the presence of water vapor in a vacuum apparatus or evaporating W or $WO_3$ in the presence of water vapor by an electron beam, at a pressure of 1–20 Torr, thus obtaining $WO_3$ nanoparticles having a length of up to 0.3 microns;

b) heating the $WO_3$ nanoparticles having a length of up to 0.3 microns under reducing conditions at 800–850° C., for about 10 minutes to obtain $WO_3$ nanowhiskers having a length of up to 10 microns; and c) annealing the $WO_3$ nanoparticles obtained in step (b) in a reducing atmosphere with $H_2S$ or $H_2Se$ gas or with $H_2$ gas and S or Se vapor, or by alternating the annealing atmosphere with $H_2S$ and $H_2Se$ or with $H_2$ gas and S or Se vapor, at 800–850° C., thus obtaining relatively long and hollow $WS_2$ and/or $WSe_2$ nanotubes having a length from 10 microns to more than 20 microns.

10. A method according to claim 9, wherein the pressure in step a) is between 8 and 12 Torr.

11. A method according to claim 9, wherein in step b) the temperature is between 835 and 840° C.

12. A method according to claim 9, wherein in step c) the temperature is between 835 and 840° C.

13. A method according to claim 6, wherein said chalcogenation is sulfidization or selenization.

14. A method according to claim 6, wherein said $H_2X$ is $H_2S$ or $H_2Se$.

15. A method according to claim 13, wherein said $H_2X$ is $H_2S$ or $H_2Se$.

* * * * *